(12) United States Patent
Oh et al.

(10) Patent No.: US 11,701,909 B2
(45) Date of Patent: Jul. 18, 2023

(54) METHOD OF CONTROLLING PROPERTIES OF NANOPARTICLES AND PATTERNING WITH NANOPARTICLES BY INK LITHOGRAPHY

(71) Applicant: Korea University Research and Business Foundation, Seoul (KR)

(72) Inventors: Soong Ju Oh, Seoul (KR); Jun Hyuk Ahn, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 17/709,548

(22) Filed: Mar. 31, 2022

(65) Prior Publication Data

US 2022/0388323 A1  Dec. 8, 2022

(30) Foreign Application Priority Data

Jun. 7, 2021 (KR) .................. 10-2021-0073593

(51) Int. Cl.
| | |
|---|---|
| G03F 7/00 | (2006.01) |
| B41M 1/06 | (2006.01) |
| C09D 11/037 | (2014.01) |
| C09D 11/38 | (2014.01) |
| C09D 11/322 | (2014.01) |
| C09D 11/033 | (2014.01) |

(52) U.S. Cl.
CPC ............ *B41M 1/06* (2013.01); *C09D 11/033* (2013.01); *C09D 11/037* (2013.01); *C09D 11/322* (2013.01); *C09D 11/38* (2013.01); *G03F 7/0002* (2013.01)

(58) Field of Classification Search
None
See application file for complete search history.

(56) References Cited

FOREIGN PATENT DOCUMENTS

| KR | 10-0982110 B1 | 9/2010 | |
| KR | 20180069535 A * | 6/2018 | ............... H01B 5/14 |
| KR | 10-2094134 B1 | 3/2020 | |
| KR | 10-2021-0034961 A | 3/2021 | |

OTHER PUBLICATIONS

Ink-lithography for property engineering and patterning of nanocrystal thin films, Ahn et al., ACS Nano 2021, 15, 15667-15675 (Year: 2021).*

Ion Exchange Lithography: Localized Ion Exchange Reactions for Spatial Patterning of Perovskite Semiconductors and Insulators, Helmbrecht et al., Adv. Mater. 2021,33, 2005291 (Year: 2021).*

(Continued)

*Primary Examiner* — Joshua D Zimmerman
(74) *Attorney, Agent, or Firm* — Hauptman Ham, LLP

(57) ABSTRACT

Disclosed is a patterning method by ink lithography. More particularly, the patterning method includes coating thin film-forming nanoparticles surrounded by the first ligand on a substrate to form a nanoparticle thin film; directly spraying a ligand-substituting ink to a selected region on the nanoparticle thin film to form a region in which the first ligand is substituted with the second ligand; and washing the nanoparticle thin film with a washing solvent so that the region substituted with the second ligand is patterned.

10 Claims, 11 Drawing Sheets

(56) References Cited

OTHER PUBLICATIONS

Office Action dated Oct. 19, 2022, for corresponding Korean Patent Application No. 10-2021-0073593, along with an English translation (8 pages).
Lukas Helmbrecht et al., "Ion Exchange Lithography: Localized Ion Exchange Reactions for Spatial Patterning of Perovskite Semiconductors and Insulators", Advanced Materials, Apr. 12, 2021, cited in NPL No. 1 (6 pages).

* cited by examiner

METHOD OF CONTROLLING PROPERTIES OF NANOPARTICLES AND PATTERNING WITH NANOPARTICLES BY INK LITHOGRAPHY

CROSS-REFERENCE TO RELATED APPLICATION

This application claims priority to Korean Patent Application No. 10-2021-0073593, filed on Jun. 7, 2021 in the Korean Intellectual Property Office, the disclosure of which is incorporated herein by reference.

BACKGROUND OF THE DISCLOSURE

Field of the Disclosure

The present disclosure relates to a method of controlling the properties of nanoparticles and patterning the same, and more particularly, to a method of simultaneously controlling the physical properties and chemical properties of nanoparticles through direct spraying to a selected region of the nanoparticles using lithography to chemically treat the surface of the nanoparticles, thereby patterning a functional device.

Description of the Related Art

Recently, various studies are actively underway to fabricate nanoparticle-based devices. Nanoparticles are suitable for fabricating devices with a very small area due to the small size thereof. In addition, since the physical and chemical properties of nanoparticles change according to the size thereof, there is an advantage in that device performance can be improved through particle size control. Further, various physical properties are changed according to a surface state due to the very large surface area of nanoparticles compared to the volume thereof.

Research into surface ligands surrounding nanoparticles is essential so as to increase the stability of nanoparticles and impart functionality thereto. By substituting colloidal nanoparticles immediately after synthesis surrounded by long organic ligands with short organic ligands and inorganic ligands or organic/inorganic complex ligands, electron movement is facilitated and, accordingly, electrical properties are exhibited, and at the same time, functionality is imparted due to ligands and, accordingly, various properties are exhibited. As examples of representative physical properties and functionalities, there are, for example, electrical properties, electro-mechanical properties, electrothermal properties, thermal properties, mechanical properties, magnetic properties, optical properties, photoelectric properties, etc.

As existing patterning methods of selectively imparting functionality to nanoparticles to fabricate a device, there are photolithography, optical lithography, thermal evaporation, etc. In the case of these processes, a photo mask and a shadow mask must be used so as to position functional nanoparticles (nanocrystal, NC) to have a desired shape and size only in a desired area. Accordingly, contamination of materials and deterioration of properties may occur due to contact with the mask. In addition, characteristics and physical properties may be altered by conditions such as photoresist (PR), developer, light, temperature, and high vacuum which are essential during a patterning process, but which can easily damage nanoparticles, resulting in deterioration of device performance.

Spray coating technology and inkjet printing technology, which are direct injection methods used to solve the problems, do not include a mask or photoresist for patterning, a developer, etc., whereby the above-mentioned disadvantages can be addressed to some extent. However, in the case of the fabrication methods, byproducts may be generated or agglomerated and sintered due to the low stability of nanoparticles although the technique of directly spraying functional nanoparticles (nanocrystals, NC) onto a substrate is used. In addition, the methods require a co-surfactant and an additional step such as annealing, thereby not being a complete solution. Accordingly, there is a need for a patterning technique that can simultaneously impart patterns and functionality at room temperature and under atmospheric pressure without directly contacting nanoparticles.

Related Art Document

Patent Document

Korean Patent Registration No. 10-0982110, "METHOD OF FABRICATING A ULTRA FINE PATTERN USING A ORGANOMETALLIC SOLUTION"

SUMMARY OF THE DISCLOSURE

Therefore, the present disclosure has been made in view of the above problems, and it is an object of the present disclosure to provide a patterning method including spin coating colloidal nanoparticles to fabricate a thin film, and then adding a ligand solution for controlling the surface of nanoparticles to an inkjet cartridge, followed by printing, thereby fabricating a desired circuit.

It is another object of the present disclosure to provide a nanoparticle patterning method of being capable of simultaneously controlling the chemical properties and physical properties of the circuit of the pattern using the inkjet printing technique.

It is still another object of the present disclosure to provide a nanoparticle patterning method capable of optimizing resolution by mixing isopropanol (isopropyl alcohol, IPA), which is a hydroxyl group (—OH) solvent, with a polar solvent such as ethylene glycol (EG) having high viscosity in a certain composition ratio so as to greatly improve low resolution that is a technical weakness of the inkjet printing technique.

It is yet another object of the present disclosure to provide various nanoparticle thin film-based electronic, optical, and optoelectronic devices and sensors fabricated using the nanoparticle patterning method.

In accordance with an aspect of the present disclosure, the above and other objects can be accomplished by the provision of a patterning method by ink lithography, the patterning method including: coating nanoparticles surrounded by a first ligand on a substrate to form a nanoparticle thin film; spraying a ligand-substituting ink to a partial region of the nanoparticle thin film formed on the substrate to form a first region, in which the first ligand is substituted with a second ligand, and a second region in which the first ligand is not substituted with the second ligand; and washing the nanoparticle thin film with a washing solvent so that the region substituted with the second ligand is patterned.

In the patterning method by ink lithography according to the present disclosure, the first ligand may be an organic ligand.

In the patterning method by ink lithography according to the present disclosure, the organic ligand may have hydrophobic chemical properties.

In the patterning method by ink lithography according to the present disclosure, the second ligand may be an inorganic ligand or an organic/inorganic complex ligand.

In the patterning method by ink lithography according to the present disclosure, the inorganic ligand or the organic/inorganic complex ligand may have hydrophilic chemical properties.

In the patterning method by ink lithography according to the present disclosure, the spraying of the ligand-substituting ink may be any one selected from the group consisting of inkjet printing, spray coating, calligraphy and dropping.

In the patterning method by ink lithography according to the present disclosure, the washing solvent may be a non-polar solvent.

In the patterning method by ink lithography according to the present disclosure, the non-polar solvent may disperse nanoparticles having hydrophobic chemical properties.

In the patterning method by ink lithography according to the present disclosure, the non-polar solvent may be at least one selected from among octane, hexane, toluene, cyclohexane, chlorobenzene, benzene, chloroform and diethyl ether.

In the patterning method by ink lithography according to the present disclosure, the second region may be removed by the washing so that the first region only remains on the substrate.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
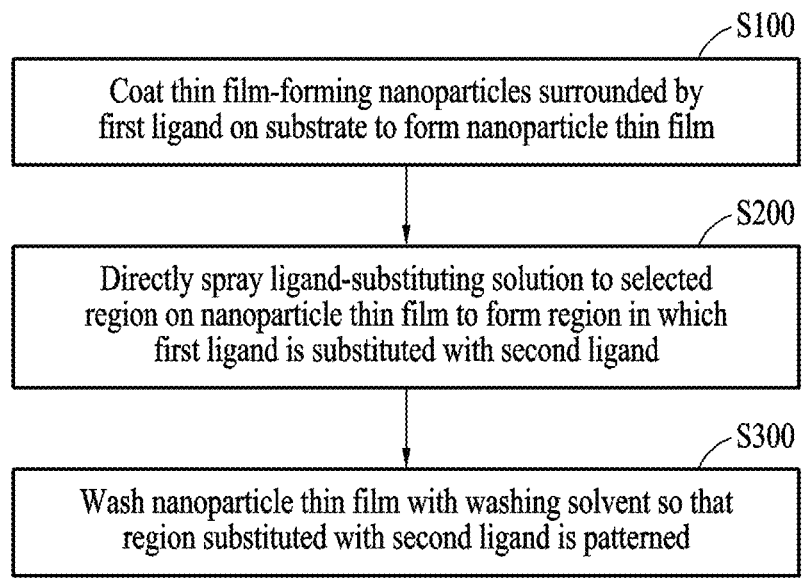
FIG. 1 is a flowchart illustrating a patterning method by ink lithography according to the present disclosure.

The present disclosure will now be described more fully with reference to the accompanying drawings and contents disclosed in the drawings. However, the present disclosure should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the disclosure and the appended claims, the singular forms "a", "an" and "the" are intended to include the plural forms as well, unless context clearly indicates otherwise.

In addition, when an element such as a layer, a film, a region, and a constituent is referred to as being "on" another element, the element can be directly on another element or an intervening element can be present.

Hereinafter, a patterning method by ink lithography according to an embodiment of the present disclosure is described with reference to the accompanying drawings.

FIG. 1 is a flowchart illustrating a patterning method by ink lithography according to the present disclosure.

Referring to FIG. 1, a patterning method by ink lithography includes a step of coating thin film-forming nanoparticles surrounded by a first ligand on a substrate to form a nanoparticle thin film (S100), a step of directly spraying a ligand-substituting ink onto a selected region on the nanoparticle thin film to form the first ligand such that the first ligand in a pattern is substituted with a second ligand (S200) and a step of washing the nanoparticle thin film including the second ligand-substituted pattern with a washing solvent (S300).

S100 may further include a step of preparing thin film-forming nanoparticles surrounded by the first ligand before performing S100.

The thin film-forming nanoparticles surrounded by the first ligand may be nanoparticles (nanocrystals, NC) wherein inorganic particles (inorganic core) are surrounded by organic ligands (organic shell), and the nanoparticles have a ratio of a high surface area per unit volume.

The nanoparticles may have chemical properties (hydrophobicity or hydrophilicity) due to the first ligand. Such a characteristic may be changed by surface chemistry.

The nanoparticle thin film is formed by coating a substrate with the thin film-forming nanoparticles surrounded by the first ligand. Here, the entire surface of the nanoparticle thin film is surrounded by the first ligand. The first ligand particles are positioned to surround the surface of the nanoparticle thin film, thereby existing in the form of a first ligand layer.

In S100, the first ligand may be an organic ligand. The organic ligand may be one or more selected from the group consisting of Trioctylphosphineoxide (TOPO), octadecanol, oleic acid and oleylamine.

In S100, the thin film-forming nanoparticles may be metal or semiconductor nanoparticles. The metal may include at least one of gold (Au), silver (Ag), copper (Cu), aluminum (Al), platinum (Pt), nickel (Ni), tungsten (W), and iron (Fe), and the semiconductor nanoparticles may be one or more selected from the group consisting of cadmium selenide (CdSe), lead selenide (PbSe), lead sulfide (PbS), perovskite such as $CsPbBr_3$, zinc oxide (ZnO), and the like.

The nanoparticles may be synthesized using a wet chemical method which is a low-cost mass process. To facilitate the dispersion of the nanoparticles in a solution during synthesis (to increase colloidal stability), acid acid/oleylamine, which is an organic ligand, is added. Since oleic acid and oleylamine have a long carbon chain length, hydrophobic chemical properties are exhibited.

That is, the step, which may be further included before S100, of preparing the thin film-forming nanoparticles surrounded by the first ligand is a step of synthesizing the thin film-forming nanoparticles surrounded by the first ligand.

In S100, the coating is preformed using the thin film-forming nanoparticles surrounded by the first ligand. Here, the coating is performed using a solution including the thin film-forming nanoparticles surrounded by the first ligand and a solvent for dispersing the thin film-forming nanoparticles surrounded by the first ligand.

The solvent for dispersing the thin film-forming nanoparticles surrounded by the first ligand may be at least one of octane, hexane, and toluene depending upon an embodiment. The solvent is not specifically limited so long as it is a non-polar solvent.

In S100, the coating may be any one selected from the group consisting of spin coating, spray coating, ultra-spray coating, electrospinning coating, slot die coating, gravure coating, bar coating, roll coating, dip coating, shear coating, screen printing, inkjet printing, nozzle printing, and the like. The substrate is coated using the selected coating method, thereby forming a nanoparticle thin film.

In S100, the nanoparticle thin film may be formed without a drying process after coating the substrate by the coating method.

Figure 12A:
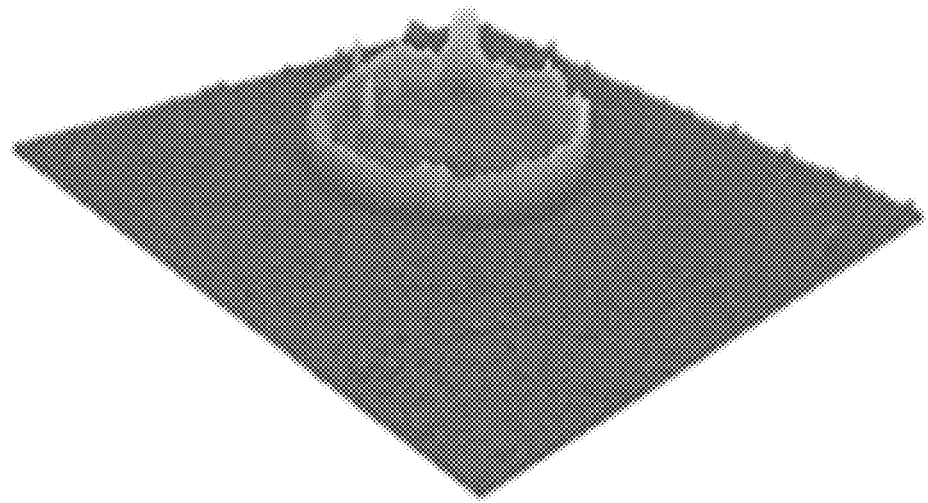
FIGS. 12a to 12c illustrate photographs of a ligand-substituting ink droplet of the present disclosure obtained by atomic force microscopy (AFM).
Figure 12B:
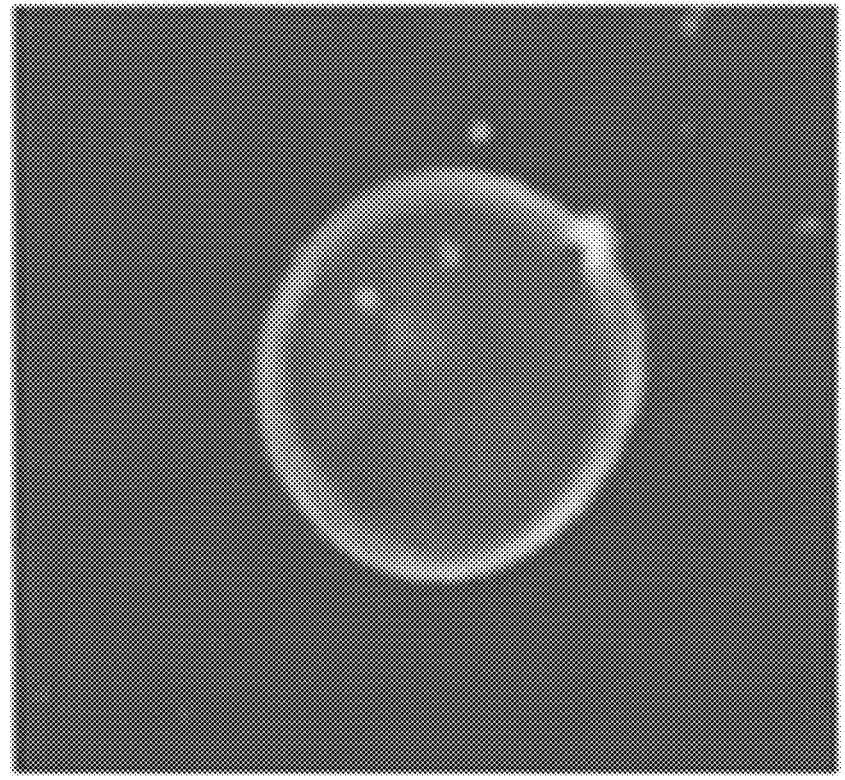
Figure 12C:
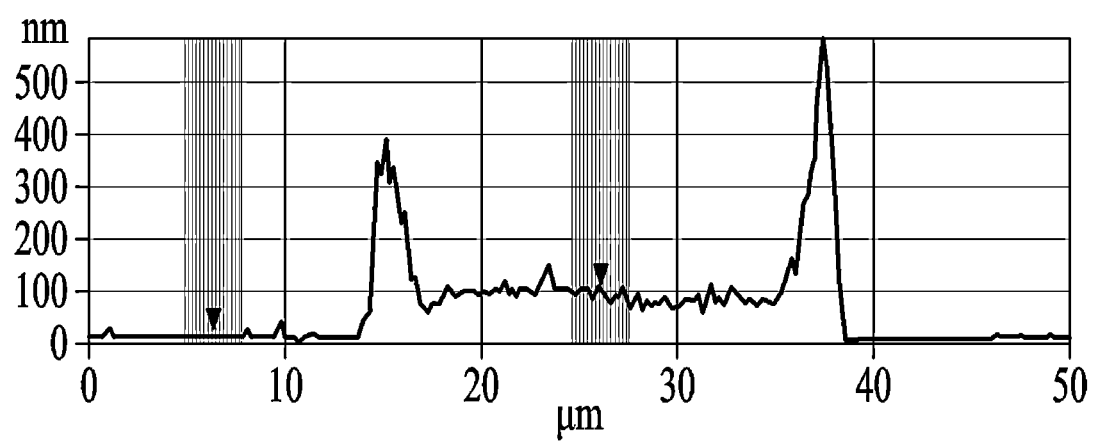

In the case of inkjet printing, about 10 pL of droplets are emitted at a time. FIGS. 12a to 12c illustrate a photograph of an ink droplet obtained by AFM (Atomic Force Microscopy). FIG. 12a illustrates a side view of the ink droplet, FIG. 12b illustrates a top view of the ink droplet, and FIG. 12c illustrates that about 10 pL of the ink is generated as a droplet with a diameter of about 30 μm on a colloidal nanoparticle-based thin film. Here, several pL of volatile solvents such as isopropanol (IPA) and methanol used as printing solvents may be evaporated within about 1 second. Accordingly, no additional drying/evaporation process is required.

The substrate supports the nanoparticle thin film, and the substrate may be formed of glass, quartz, $Al_2O_3$, SiC, Si, GaAs or InP and may be a substrate formed of a material with flexibility and insulating properties such as polydimethylsiloxane (PDMS), polyimide (PI), polyethersulfone (PES), polyacrylate (PAR), polyetherimide (PEI), polyethylene naphthalate (PEN), polyethylene terephthalate (PET), polyphenylene sulfide (PPS), polyarylate, polycarbonate (PC), cellulose triacetate (CTA) and cellulose acetate propionate (CAP), but the present disclosure is not limited thereto.

In S200, the ligand-substituting ink is directly sprayed to the selected region on the nanoparticle thin film to form a first region whose first ligand is substituted with the second ligand and a second region whose first ligand is substituted with the second ligand.

In S200, the spraying may be one or more selected from the group consisting of printing, inkjet printing, writing, calligraphy using a pen, dropping, spray coating, brushing, and the like.

In S200, the ligand-substituting ink is sprayed only to a selected region of the first ligand layer so that the first ligand present in the selected region is substituted with the second ligand. Here, when an inorganic ligand is present in the ligand-substituting ink, the inorganic ligand, and the first ligand which is an organic ligand may form an organic/inorganic complex ligand, or the organic ligand which is the first ligand may be completely substituted with the inorganic ligand. When an organic/inorganic complex ligand is present in the ligand-substituting ink, the organic ligand which is the first ligand may be completely substituted with the organic/inorganic complex ligand.

In S200, the ligand-substituting ink may substitute an organic ligand with an inorganic ligand or an organic/inorganic complex ligand, so that the second ligand may be an inorganic ligand or an organic/inorganic complex ligand.

In S200, the ligand-substituting ink includes a polar solvent and an inorganic ligand solute or an organic/inorganic complex ligand solute.

The polar solvent may be one or more selected from a hydroxyl group solvent group consisting of methanol, ethanol, butanol, isopropanol, acetone, dimethylformamide (DMF), and the like.

The hydroxyl group solvent ionizes the organic ligand which is the first ligand, thereby having high reactivity. In addition, the hydroxyl group solvent can easily detach long organic ligands immediately after synthesis.

However, a hydroxyl group solvent may show low resolution during inkjet printing due to low viscosity, and due to the low resolution, the performance of a nanoparticle thin film may be decreased.

Here, when the ligand-substituting ink includes a polar solvent with high viscosity and high surface energy, the resolution may be greatly increased. A polar solvent having high viscosity and high surface energy may be ethylene glycol (EG), etc.

Here, the polar solvent having high viscosity and high surface energy may be mixed in a volume of 0.1 v/v % to 5 v/v %, preferably 0.1 v/v % to 1 v/v %, more preferably 0.5 v/v %, based on a total volume of the ligand-substituting ink.

When the polar solvent having high viscosity and high surface energy further includes a ligand-substituting ink, low resolution, which is a problem of the spraying method, specifically inkjet printing, may be improved.

Examples of the inorganic ligand solute or the organic/inorganic complex ligand solute are as follows. First, the inorganic ligand may be tetramethylammonium hydroxide (TMAOH), trioctylamine (TOA), tert-butylammonium halide (TBAX), sodium halide (NaX), potassium halide (KX), indium halide ($InX_3$), ammonium halide ($NH_4X$), where X is a halogen element such as Cl, Br, or I. The organic/inorganic complex ligand may be acid and sulfide groups such as 3-mercaptopropionic acid (MPA), lead actinium (PbAc$_2$), or 1,2-ethanedithiol (EDT).

Substituting the first ligand with the second ligand in S200 allows simultaneous change of chemical properties and physical properties according to a ligand. Specifically, a part substituted with the second ligand is referred to as a first region, and a part which is not substituted with the second ligand and thus in which the first ligand remains is referred to as a second region.

The chemical properties may be largely divided into hydrophilic properties and hydrophobic properties. Hydrophilicity is friendly to polar solvents, and hydrophobicity is friendly to non-polar solvents. These properties are also indicated by solubility difference.

In S300, an organic ligand having hydrophobic properties may be removed using the solubility difference. Accordingly, the washing solvent in S300 may be a non-polar solvent, and the non-polar solvent may be one or more selected from the group consisting of octane, hexane, toluene, cyclohexane, chlorobenzene, benzene, chloroform and diethyl ether.

In the washing step of S300, the first ligand that is not substituted with the second ligand, i.e., an organic ligand that is not substituted with an inorganic ligand or an organic/inorganic ligand, may be removed, and patterning onto the substrate may be completed by leaving the second ligand patterned on the finally selected region.

The patterning method by ink lithography uses surface chemistry that is a chemical phenomenon occurring at an interface between a solid surface and a liquid surface. For the patterning, different chemical properties between nanoparticle surfaces and a solvent surface are used.

The pattern is formed in a line shape. The width between the lines is 30 μm to 40 μm, which can be confirmed from FIG. 12c. To fabricate a pattern having a width of 30 μm or less, a cartridge should be changed from 10 pL to 1 pL. However, if a cartridge is changed, there is a possibility that sufficient ligand exchange does not occur, and thus, reproducibility is a limited. That is, when the ligand-substituting ink is sprayed in a small amount, the sprayed ligand-substituting ink evaporates before the ligand is sufficiently substituted on the nanoparticle-based thin film, so that patterning and functionalization cannot be achieved.

Figure 2:
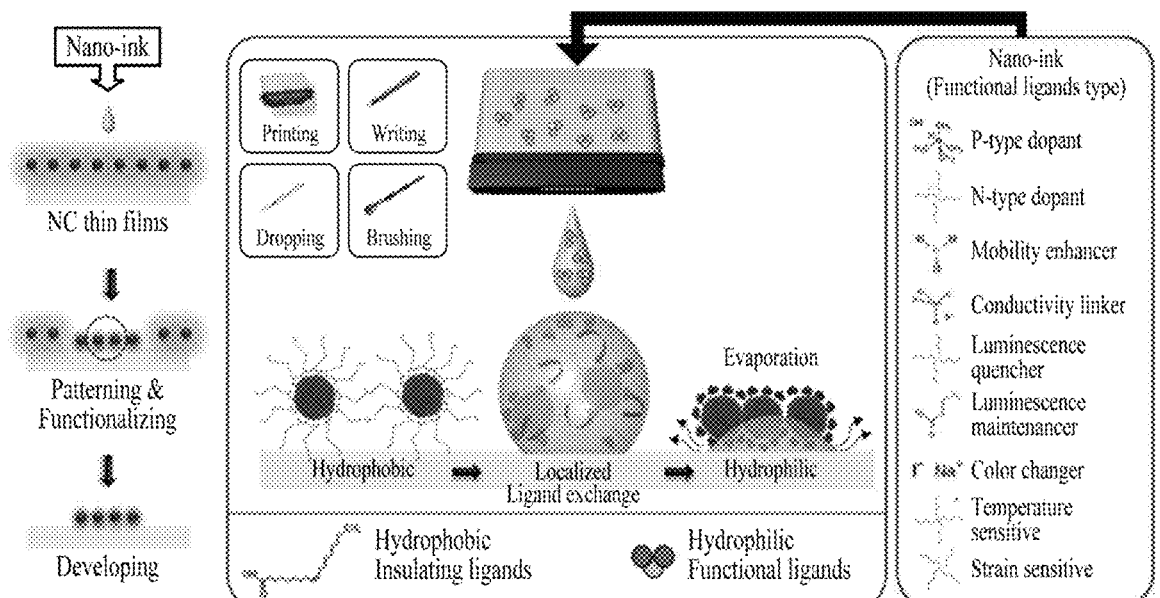
FIG. 2 illustrates a schematic diagram of a patterning method by ink lithography according to an embodiment of the present disclosure.

FIG. 2 illustrates a schematic diagram of a patterning method by ink lithography according to an embodiment of the present disclosure.

Referring to FIG. 2, when a nano ink that is a ligand-substituting ink for substituting an organic ligand is directly sprayed to a selected region of nanoparticles that form a nanoparticle thin film (NC thin film) formed on a substrate, the nanoparticle thin film formed on the substrate is patterned and the nanoparticles in the selected region are functionalized while the organic ligand of the nanoparticles in the selected region is substituted with an inorganic ligand or an organic/inorganic ligand (localized ligand exchange).

The organic ligand is a hydrophobic insulting ligand having hydrophobic chemical properties, and the organic ligand of the nanoparticles in the selected region evaporates while being substituted with an inorganic ligand or an organic/inorganic ligand. The substituted inorganic ligand or organic/inorganic ligand may be a hydrophilic functional ligand having hydrophilic chemical properties.

Here, when the organic ligand of the nanoparticle thin film is washed with a non-polar solution as a developing solution, the nanoparticles, substituted with an inorganic ligand or an organic/inorganic ligand, in the selected region are not dispersed, but nanoparticles having other organic ligands are dispersed in non-polar solution and removed.

As inorganic ligand exchange proceeds by a ligand substitution process, nanoparticles exhibit overall hydrophilicity, and the nanoparticles exhibiting hydrophilicity is not dispersed in a non-polar solvent and is dispersed in a polar solvent. This chemical contrast performs a stripping function, such as controlling a dissolution rate in conventional photolithography, thereby inducing patterning.

The nanoink may include various functional ligand types such as a P-type dopant ligand, an N-type dopant ligand, a mobility enhancer ligand, a luminescence quencher ligand, a luminescence maintenance ligand, a color changer ligand, a temperature sensitive ligand, and a strain sensitive ligand.

Figure 3:
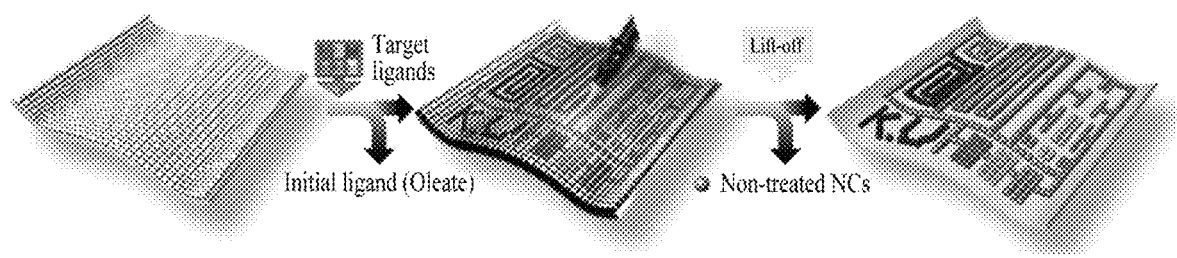
FIG. 3 is a schematic diagram illustrating the principle of a patterning method by ink lithography according to an embodiment of the present disclosure.

FIG. 3 is a schematic diagram illustrating the principle of a patterning method by ink lithography.

Referring to FIG. 3, when an initial ligand (oleate), which is a first ligand, of nanoparticles forming a nanoparticle thin film on a substrate is substituted with a target ligand which is a second ligand, non-substituted nanoparticles are lifted-off from the substrate by washing, so that a portion substituted with the second ligand only remains, thereby forming a pattern.

More specifically, since a portion not in contact with the ligand-substituting ink has hydrophobicity, the portion is dispersed and separated from the substrate when brought into contact with a non-polar solvent such as hexane, octane, or toluene.

Conversely, a portion in contact with inorganic ligand ink has hydrophilicity, thus not being stripped by a non-polar solvent such as hexane, octane, or toluene. Using such a principle, the present disclosure may simultaneously perform patterning and physical property control.

The present disclosure may simultaneously perform property engineering and patterning using nanoparticles having a very large surface area ratio. The physical properties of nanoparticles are changed by the surface state thereof. Using this, solubility contrast may be induced and, further, the nanoparticles may be imparted with physical properties using the role of functional groups.

That is, the control of the physical properties of the nanoparticles and the fabrication of circuit may simultaneously performed by controlling the surface of the nanoparticles.

Figure 10:
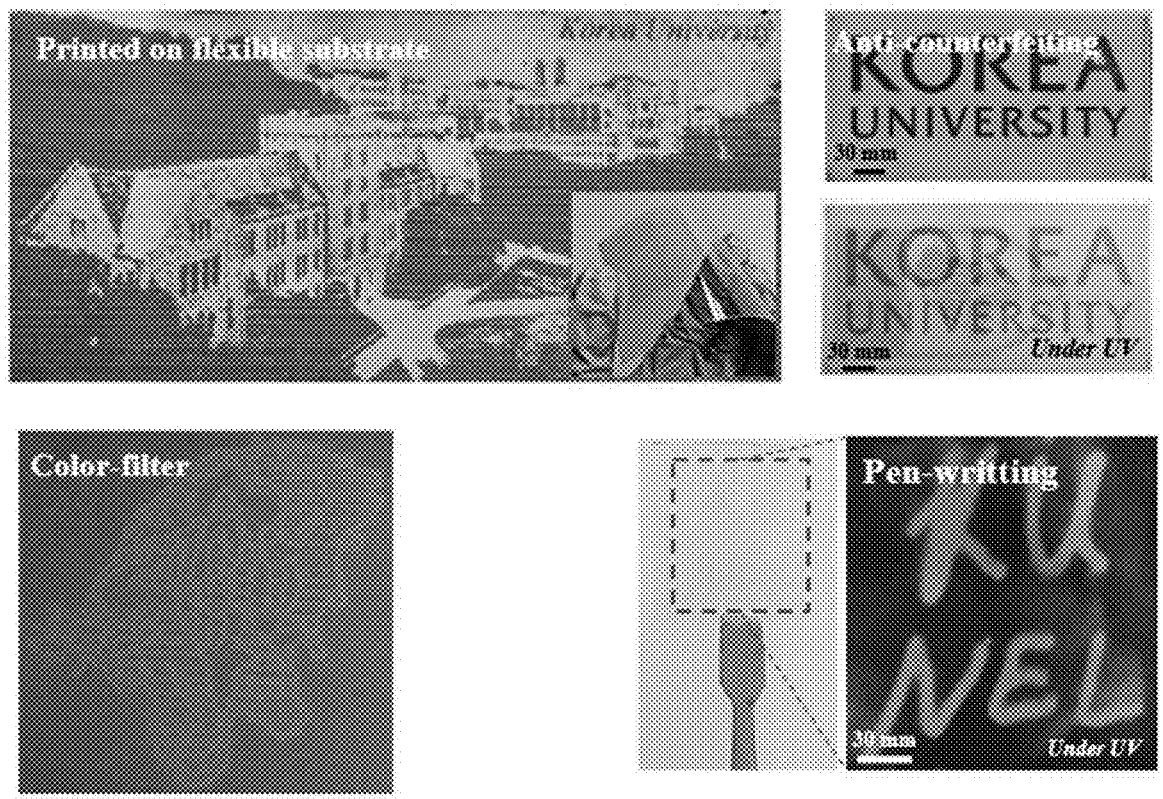
FIG. 10 illustrates images of various cases to which a patterning technique of the present disclosure is applied.
Figure 11:
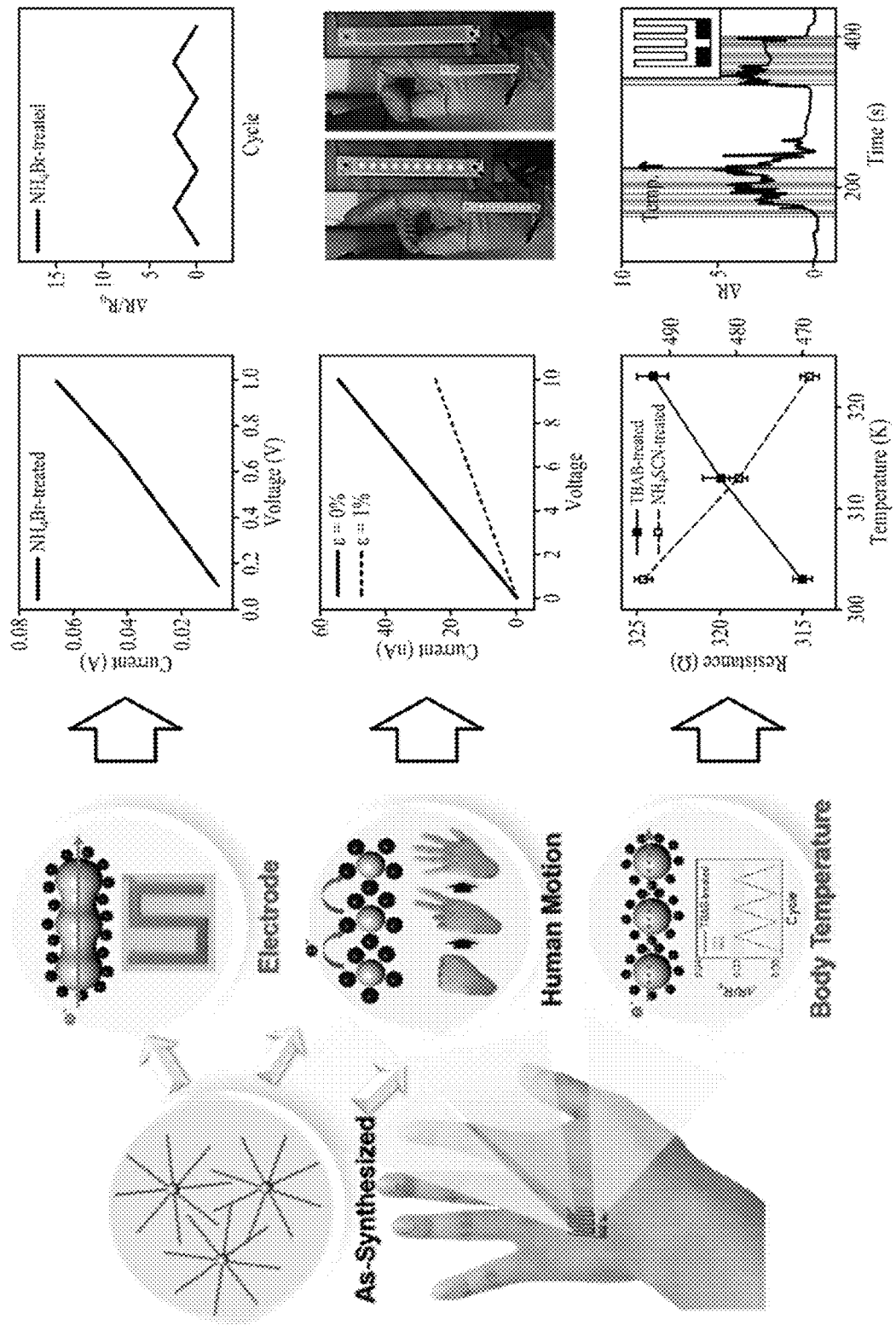
FIG. 11 illustrates various cases to which a device fabricated by a patterning technique of the present disclosure is applied.

FIGS. 10 and 11 illustrates examples (printing on a flexible substrate, anti-counterfeiting, color filter, pen-writing, sensor, electrode, (human) motion detection, body temperature detection) to which the patterning method of the present disclosure is actually applied.

Fabrication Example

Reagents

Cadmium oxide (CdO, 99.5%, powder), selenium (Se, metal basis), diphenylphosphine (DPP, >95%), oleic acid (OA, tech., 90%), oleylamine (OAm, 70%), tetrabutylammonium bromide (TBAB, ACS reagent), MPA (>99%), indium chloride (InCl$_3$, 95%), lead bromide (lead (II) bromide, >98%), lead oxide (99.999%, trace metals basis), TOA (95%), 1-octadecene (ODE, 90%), and zinc-acetate dehydrate (ACS reagent, >98%) were purchased from Sigma-Aldrich. Silver nitrate (AgNO$_3$, ACS, >99.9%), tetrabutylammonium iodide (TBAI, 98%), NaI (99+% dry weight, water), TMAOH (25% w/w in methanol), cesium bromide (CsBr, 99.999%, metal basis), and dimethyl sulfoxide (DMSO, anhydrous, 99.8%) were purchased from Alfa Aesar. Toluene (99.5%), ethanol (95.0%), methanol (99.5%), acetone (99.5%), potassium hydroxide (KOH, 95.0%), and isopropanol (99.5%) were purchased from Samchun Chemicals. Ammonium bromide (NH$_4$Br, ACS Reagent>99.0%), ammonium iodide (NH$_4$I, ACS Reagent, 99%), ammonium chloride (NH$_4$Cl, ACS Reagent, >99.0%), ammonium thiosinate (NH$_4$SCN, ACS Reagent, >97.5%) were purchased from Honeywell Fluka.

Oleic acid (90%), oleylamine (70%), TBAI (Tetra-butyl ammonium iodide), TBAB (99.0%), MBA (Tetrabutylammonium iodide), methanol (99.8%), ethanol (99.5%) and isopropanol (99.5%) were purchased from Sigma-Aldrich.

A PET film having a thickness of 250 μm was purchased from SKC Film, and used as a flexible substrate.

Preparation Example 1. Nanoparticle (Nanocrystal) Synthesis

Preparation Example 1-1

1.7 g of silver nitrate (AgNO$_3$), 45 mL of oleic acid (OA) and 5 mL of oleylamine (OAm) were fed into a three-necked flask and mixed using magnetic stirring, thereby preparing a mixed solution.

To remove moisture and oxygen in the mixed solution, the mixed solution was degassed at 70° C. for 1 hour and 30 minutes.

After degassing, the temperature of the three-necked flask was elevated to up to 180° C. at a rate of 1° C./min, followed by cooling to room temperature. As a result, nanoparticles (Ag NC) were synthesized.

The synthesized silver nanoparticles were washed three times through centrifugation using toluene and ethanol at 5000 rpm for 5 minutes.

The precipitated silver nanoparticles were dispersed at a concentration of 200 mg/mL in octane, thereby preparing a solution including silver nanoparticles surrounded by the first ligand.

Preparation Example 1-2

27.2 mg of CsBr and 59.0 g of PbBr$_2$ were dissolved in 4 mL of dimethylformamide (DMF).

2 mL of the solution was mixed with 0.2 mL of oleic acid and 0.1 mL of oleylamine. The mixture was poured into 50 mL toluene in a flask using a stirring rod.

When stirred for one minute or more, green light appeared.

The solution was mixed with 30 mL of methyl acetate and centrifuged at 8000 rpm for 3 minutes, thereby synthesizing a CsPbBr$_3$ perovskite nanoparticle powder.

The nanoparticles were dispersed at concentration 10 mg/mL in hexane, so that a solution including CsPbPr$_3$ perovskite nanoparticles surrounded by the first ligand was prepared.

Preparation Example 1-3

0.3 g of cadmium oxide (CdO), 2.2 mL of oleic acid (OA) and 100 mL of 1-octadecene (ODE) were fed into a 200 mL three-necked flask and mixed using magnetic stirring, thereby preparing a mixed solution.

The mixed solution was degassed at 100° C. for 30 minutes.

After degassing, when the three-necked flask was heated to 240° C. in a nitrogen atmosphere and the solution was maintained at 270° C., the solution became colorless.

A selenium (Se) precursor was added to the three-necked flask.

The selenium (Se) precursor was prepared by mixing 2.0 g of oleic acid, 17.5 mL of ODE and 0.376 g of Se in a three-necked flask at 100° C.

A cadmium-containing solution was mixed with a selenium (Se)-containing solution, followed by cooling with a fan. As a result, cadmium selenide (CdSe) nanoparticles were synthesized.

The synthesized cadmium selenide nanoparticles were centrifuged using IPA and acetone at 5000 rpm, and then washed three time with toluene and ethanol.

The nanoparticles were dispersed at a concentration of 30 mg/mL in hexane or octane, thereby preparing a solution including the cadmium selenide nanoparticles surrounded by the first ligand.

Preparation Example 1-4

0.892 g of PbO, 3 mL of oleic acid and 20 mL of ODE were fed into a three-necked flask and mixed using magnetic stirring, thereby preparing a mixed solution.

The mixed solution was degassed for 90 minutes, and then heated to 120° C.

After heating to 180° C., a prepared selenium (Se) precursor was added to the mixed solution.

The precursor was prepared by dissolving selenium (Se) at 1 molar concentration in a trioctyl phosphate (TOP) solvent and by mixing the dissolved solution with 0.06 mL of diphenylphosphine (DPP).

After reacting for 100 seconds, a heating mantle was removed and the mixed solution was cooled to 25° C.

In a glove box, the mixed solution was fend into a bottle containing 5 mL of hexane, and EtOH/IPA was injected thereinto, thereby precipitating lead selenide (PbSe) nanoparticles.

The mixture was centrifuged at 5000 rpm for 5 minutes, and then washed four times with acetone and ethanol.

The lead selenide nanoparticles were dispersed in 10 mL of hexane, thereby preparing a solution including the silver nanoparticles surrounded by the first ligand.

Preparation Example 2. Synthesis of Ligand-Substituting Ink

Preparation Example 2-1

After mixing isopropanol (IPA) and 0.5 v/v % ethylene glycol (EG) as hydroxyl group solvents, the second ligand NH$_4$Cl was mixed at a concentration of 30 mM, thereby preparing a ligand-substituting ink.

Preparation Example 2-2

An experiment was carried out in the same manner as in Preparation Example 2-1, except that TBAB was used instead of NH$_4$Cl.

Preparation Example 2-3

An experiment was carried out in the same manner as in Preparation Example 2-1, except that TBAI was used instead of NH$_4$Cl.

Preparation Example 2-4

An experiment was carried out in the same manner as in Preparation Example 2-1, except that NaI was used instead of NH$_4$Cl.

Preparation Example 2-5

An experiment was carried out in the same manner as in Preparation Example 2-1, except that NaBr was used instead of $NH_4Cl$.

Preparation Example 2-6

An experiment was carried out in the same manner as in Preparation Example 2-1, except that TOA was used instead of $NH_4Cl$.

Preparation Example 2-7

An experiment was carried out in the same manner as in Preparation Example 2-1, except that $PbAc_2$ was used instead of $NH_4Cl$.

Preparation Example 2-8

An experiment was carried out in the same manner as in Preparation Example 2-1, except that MPA was used instead of $NH_4Cl$.

Preparation Example 2-9

An experiment was carried out in the same manner as in Preparation Example 2-1, except that TMAOH was used instead of $NH_4Cl$.

Preparation Example 2-10

An experiment was carried out in the same manner as in Preparation Example 2-1, except that $InCl_3$ was used instead of $NH_4Cl$.

Preparation Example 2-11

An experiment was carried out in the same manner as in Preparation Example 2-1, except that $NH_4SCN$ was used instead of $NH_4Cl$.

Preparation Example 2-12

An experiment was carried out in the same manner as in Preparation Example 2-10, except that dimethylformamide (DMF) was used instead of isopropanol (IPA) and 0.5 v/v % ethylene glycol.

Preparation Example 2-13

An experiment was carried out in the same manner as in Preparation Example 2-10, except that ethanol (EtOH) was used instead of isopropanol (IPA) and 0.5 v/v % ethylene glycol.

Preparation Example 2-14

An experiment was carried out in the same manner as in Preparation Example 2-10, except that isopropanol (IPA) was used instead of isopropanol (IPA) and 0.5 v/v % ethylene glycol.

Preparation Example 2-15

An experiment was carried out in the same manner as in Preparation Example 2-10, except that 1 v/v % ethylene glycol was used instead of 0.5 v/v % ethylene glycol.

Preparation Example 2-16

An experiment was carried out in the same manner as in Preparation Example 2-10, except that 5 v/v % ethylene glycol was used instead of 0.5 v/v % ethylene glycol.

In Preparation Examples 2-1 to 2-11, IPA and 0.5 v/v % ethylene glycol were used as a solvent, and only the type of the second ligand type was different. In Preparation Examples 2-12 to 2-16, $NH_4SCN$ was used as the second ligand, and only the type of the solvent was different. These particulars are summarized in Table 1 below.

TABLE 1

| Classification | Solvent | Second ligand |
|---|---|---|
| Preparation Example 2-1 | IPA + 0.5 v/v % EG | $NH_4Cl$ |
| Preparation Example 2-2 | | TBAB |
| Preparation Example 2-3 | | TBAI |
| Preparation Example 2-4 | | NaI |
| Preparation Example 2-5 | | NaBr |
| Preparation Example 2-6 | | TOA |
| Preparation Example 2-7 | | $PbAc_2$ |
| Preparation Example 2-8 | | MPA |
| Preparation Example 2-9 | | TMAOH |
| Preparation Example 2-10 | | $InCl_3$ |
| Preparation Example 2-11 | | $NH_4SCN$ |
| Preparation Example 2-12 | DMF | |
| Preparation Example 2-13 | EtOH | |
| Preparation Example 2-14 | IPA | |
| Preparation Example 2-15 | IPA + 1 v/v % EG | |
| Preparation Example 2-16 | IPA + 5 v/v % EG | |

Example 1. Fabrication of Nanoparticle Thin Film

Example 1-1

A PET substrate (thickness: 250 μm) was sequentially sonicated in each of acetone, isopropanol and deionized water for 5 minutes each.

Next, a surface of the PET substrate was treated with UV ozone to form a hydroxyl group (—OH).

Next, the PET substrate was supported in a 3-mercaptopropyl trimethoxysilane solution added in an amount of 5% by volume to toluene, thereby forming a self-assembled monolayer.

Next, the PET substrate was spin-coated with the silver nanoparticles, surrounded by the first ligand prepared according to Preparation Example 1-1, at a speed of 1000 rpm, thereby forming a nanoparticle thin film.

Example 1-2

An experiment was carried out in the same manner as in Example 1-1, except that the perovskite ($CsPbBr_3$) nanoparticles surrounded by the first ligand prepared according to Preparation Example 1-2 were used instead of the silver nanoparticles prepared according to Preparation Example 1-1 to form a nanoparticle thin film.

Example 1-3

An experiment was carried out in the same manner as in Example 1-1, except that the cadmium selenide (CdSe) nanoparticles surrounded by the first ligand prepared according to Preparation Example 1-3 were used instead of the silver nanoparticles prepared according to Preparation Example 1-1 to form a nanoparticle thin film.

Example 1-4

An experiment was carried out in the same manner as in Example 1-1, except that the lead selenide (PbSe) nanoparticles surrounded by the first ligand prepared according to Preparation Example 1-4 were used instead of the silver nanoparticles prepared according to Preparation Example 1-1 to form a nanoparticle thin film.

Examples. Ligand Substitution and Patterning of Nanoparticle Thin Film

Example 2

The ligand-substituting ink prepared according to Preparation Example 2-1 was printed in a specific pattern on the nanoparticle thin film formed on each of the PET substrates according to Example 1-1 using an inkjet printer.

Next, each of the PET substrates on which the pattern had been formed was supported in toluene and hexane as washing solvents, thereby fabricating a nanoparticle thin film patterned with the second ligand.

Example 3

An experiment was carried out in the same manner as in Example 2, except that the second ligand prepared according to Preparation Example 2-2, instead of the ligand according to Preparation Example 2-1, was patterned to fabricate a nanoparticle thin film.

Example 4

An experiment was carried out in the same manner as in Example 2, except that the second ligand prepared according to Preparation Example 2-3, instead of the ligand according to Preparation Example 2-1, was patterned to fabricate a nanoparticle thin film.

Example 5

An experiment was carried out in the same manner as in Example 2, except that the nanoparticles according to Example 1-2, instead of the nanoparticles according to Example 1-1, and the second ligand prepared according to Preparation Example 2-4, instead of the ligand according to Preparation Example 2-1, were patterned to fabricate a nanoparticle thin film.

Example 6

An experiment was carried out in the same manner as in Example 2, except that the nanoparticles prepared according to Example 1-2, instead of the nanoparticles according to Example 1-1, were patterned to fabricate a nanoparticle thin film.

Example 7

An experiment was carried out in the same manner as in Example 2, except that the nanoparticles according to Example 1-2, instead of the nanoparticles according to Example 1-1, and the second ligand prepared according to Preparation Example 2-5, instead of the ligand according to Preparation Example 2-1, were patterned to fabricate a nanoparticle thin film.

Example 8

An experiment was carried out in the same manner as in Example 2, except that the nanoparticles according to Example 1-2, instead of the nanoparticles according to Example 1-1, and the second ligand prepared according to Preparation Example 2-6, instead of the ligand according to Preparation Example 2-1, were patterned to fabricate a nanoparticle thin film.

Example 9

An experiment was carried out in the same manner as in Example 2, except that the nanoparticles according to Example 1-3, instead of the nanoparticles according to Example 1-1, and the second ligand prepared according to Preparation Example 2-7, instead of the ligand according to Preparation Example 2-1, were patterned to fabricate a nanoparticle thin film.

Example 10

An experiment was carried out in the same manner as in Example 2, except that the nanoparticles according to Example 1-3, instead of the nanoparticles according to Example 1-1, and the second ligand prepared according to Preparation Example 2-8, instead of the ligand according to Preparation Example 2-1, were patterned to fabricate a nanoparticle thin film.

Example 11

An experiment was carried out in the same manner as in Example 2, except that the nanoparticles according to Example 1-3, instead of the nanoparticles according to Example 1-1, and the second ligand prepared according to Preparation Example 2-3, instead of the ligand according to Preparation Example 2-1, were patterned to fabricate a nanoparticle thin film.

Example 12

An experiment was carried out in the same manner as in Example 2, except that the nanoparticles according to Example 1-4, instead of the nanoparticles according to Example 1-1, and the second ligand prepared according to Preparation Example 2-3, instead of the ligand according to Preparation Example 2-1, were patterned to fabricate a nanoparticle thin film.

Example 13

An experiment was carried out in the same manner as in Example 2, except that the nanoparticles according to Example 1-4, instead of the nanoparticles according to Example 1-1, and, the second ligand prepared according to Preparation Example 2-9, instead of the ligand according to Preparation Example 2-1, were patterned to fabricate a nanoparticle thin film.

Example 14

An experiment was carried out in the same manner as in Example 2, except that the nanoparticles according to Example 1-3, instead of the nanoparticles according to Example 1-1, and the second ligand prepared according to Preparation Example 2-10, instead of the ligand according to Preparation Example 2-1, were patterned to fabricate a nanoparticle thin film.

Example 15

An experiment was carried out in the same manner as in Example 2, except that the nanoparticles according to Example 1-3, instead of the nanoparticles according to Example 1-1, and the second ligand prepared according to Preparation Example 2-12, instead of the ligand according to Preparation Example 2-1, were patterned to fabricate a nanoparticle thin film.

Example 16

An experiment was carried out in the same manner as in Example 2, except that the nanoparticles according to Example 1-3, instead of the nanoparticles according to Example 1-1, and the second ligand prepared according to Preparation Example 2-13, instead of the ligand according to Preparation Example 2-1, were patterned to fabricate a nanoparticle thin film.

Example 17

An experiment was carried out in the same manner as in Example 2, except that the nanoparticles according to Example 1-3, instead of the nanoparticles according to Example 1-1, and the second ligand prepared according to Preparation Example 2-14, instead of the ligand according to Preparation Example 2-1, were patterned to fabricate a nanoparticle thin film.

Example 18

An experiment was carried out in the same manner as in Example 2, except that the nanoparticles according to Example 1-3, instead of the nanoparticles according to Example 1-1, and the second ligand prepared according to Preparation Example 2-11, instead of the ligand according to Preparation Example 2-1, were patterned to fabricate a nanoparticle thin film.

Example 19

An experiment was carried out in the same manner as in Example 2, except that the nanoparticles according to Example 1-3, instead of the nanoparticles according to Example 1-1, and the second ligand prepared according to Preparation Example 2-15, instead of the ligand according to Preparation Example 2-1, were patterned to fabricate a nanoparticle thin film.

Example 20

An experiment was carried out in the same manner as in Example 2, except that the nanoparticles according to Example 1-3, instead of the nanoparticles according to Example 1-1, and the second ligand prepared according to Preparation Example 2-16, instead of the ligand according to Preparation Example 2-1, were patterned to fabricate a nanoparticle thin film.

Comparative Example 1

A simple $CsPbBr_3$ nanoparticle thin film fabricated by not adding a ligand-substituting ink to the nanoparticles of Example 1-2.

Comparative Example 2

A simple CdSe nanoparticle thin film fabricated by not adding a ligand-substituting ink to the nanoparticles of Example 1-3.

Nanoparticle thin films and ligand-substituting ink types used in Examples 2 to 22 and Comparative Examples 1 and 2 and corresponding property evaluation results are summarized in Table 2 below.

TABLE 2

Figure 4A:
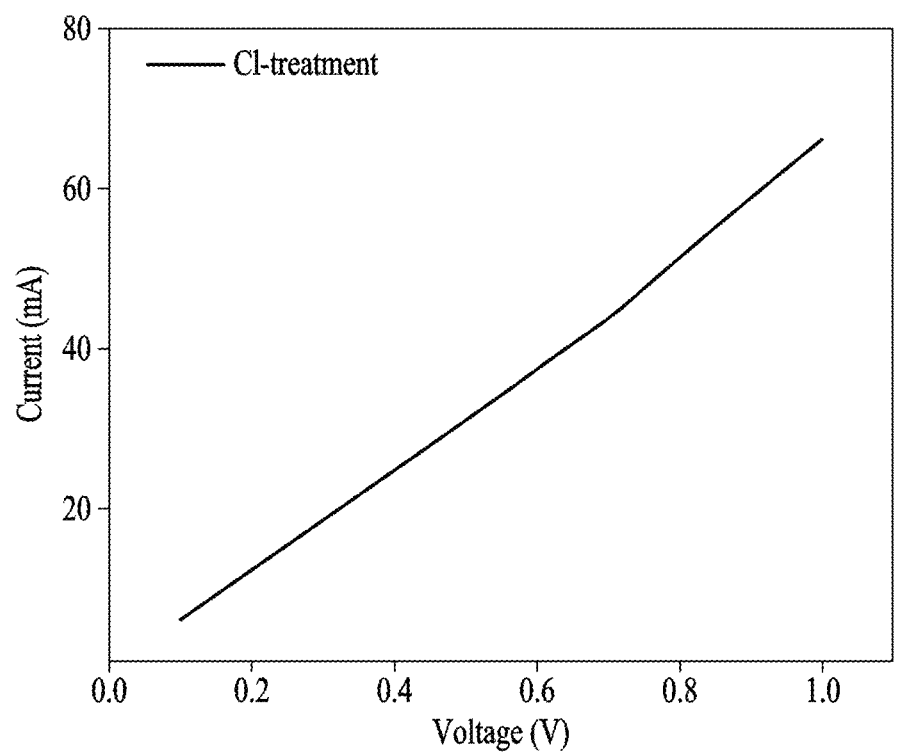
FIGS. 4a to 4c illustrate property evaluation results of substrates patterned by ink lithography according to Examples 2 to 4 of the present disclosure.
Figure 4B:
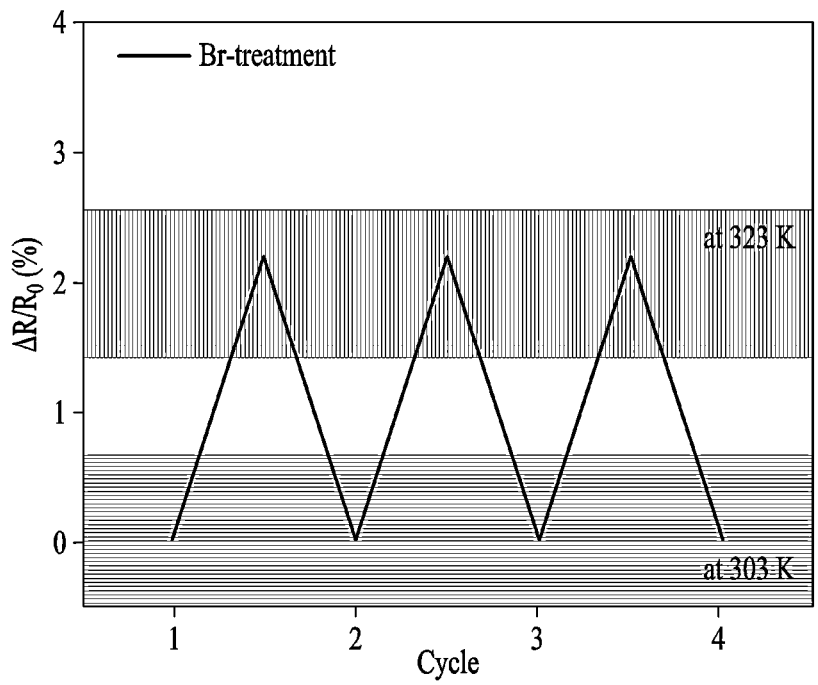
Figure 4C:
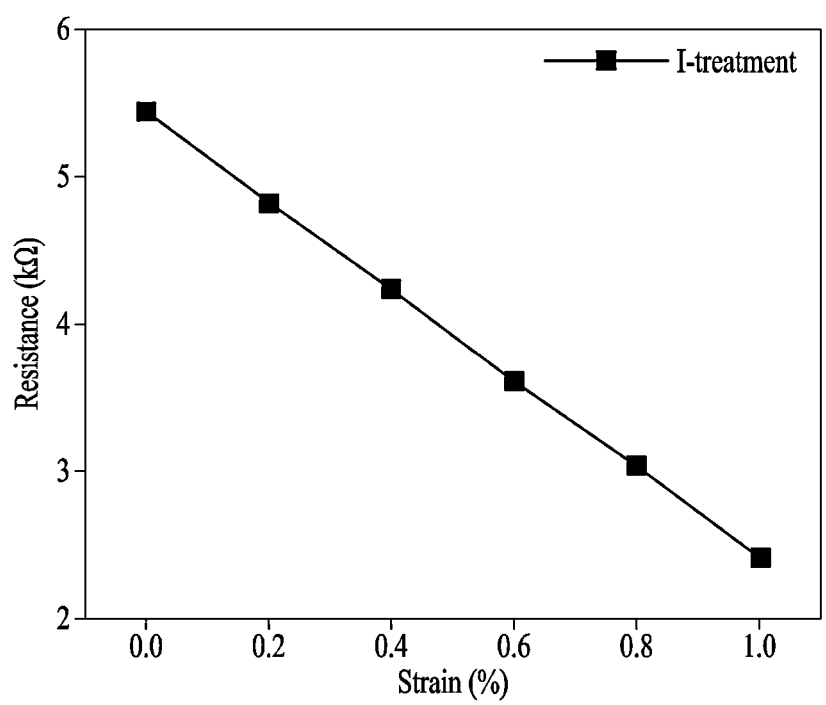
Figure 5:
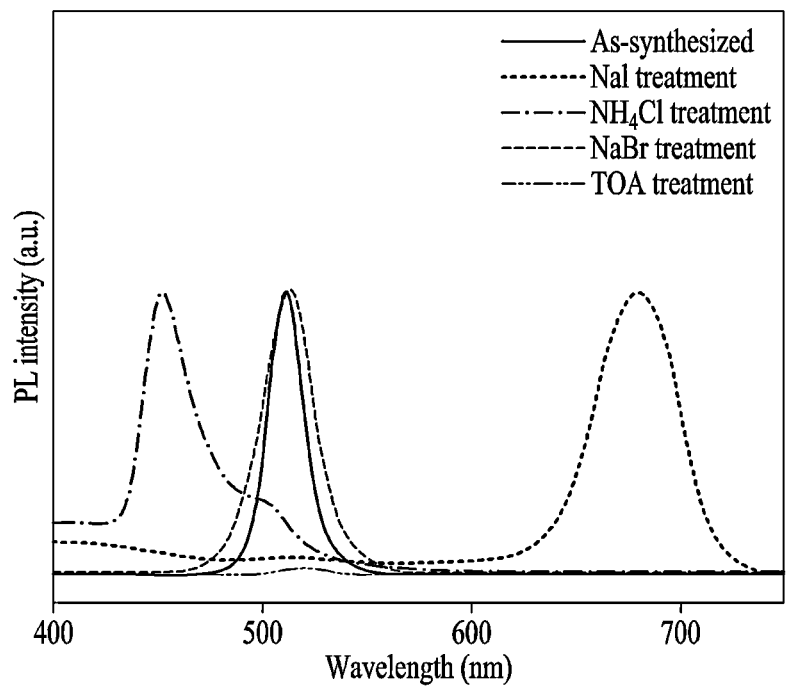
FIG. 5 illustrates property evaluation results of substrates patterned by ink lithography according to Examples 5 to 8 of the present disclosure and Comparative Example 1.
Figure 6A:
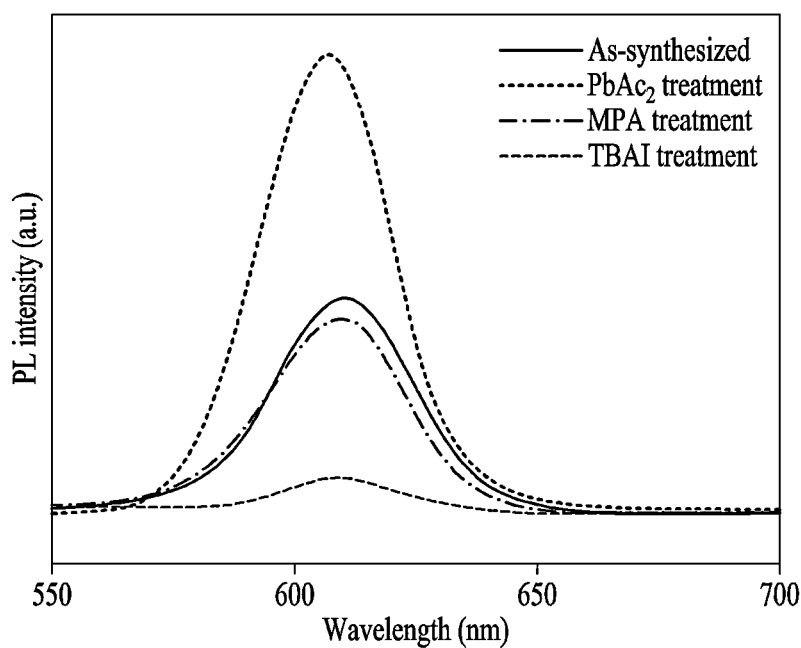
FIGS. 6a to 6d illustrate property evaluation results of substrates patterned by ink lithography according to Example 9 to Example 14 of the present disclosure and Comparative Example 2.
Figure 6B:
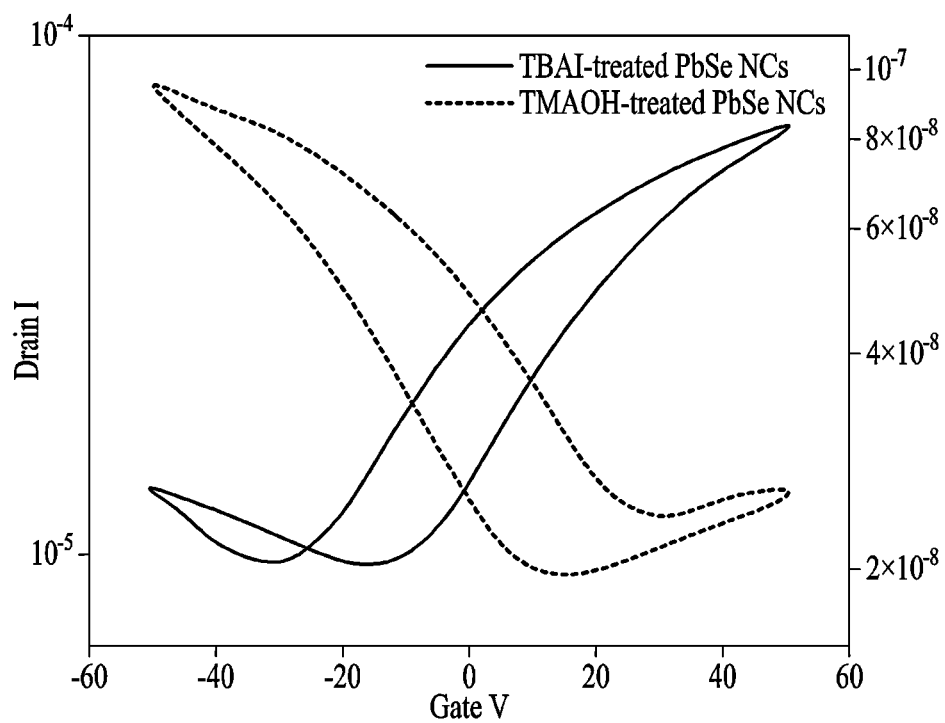
Figure 6C:
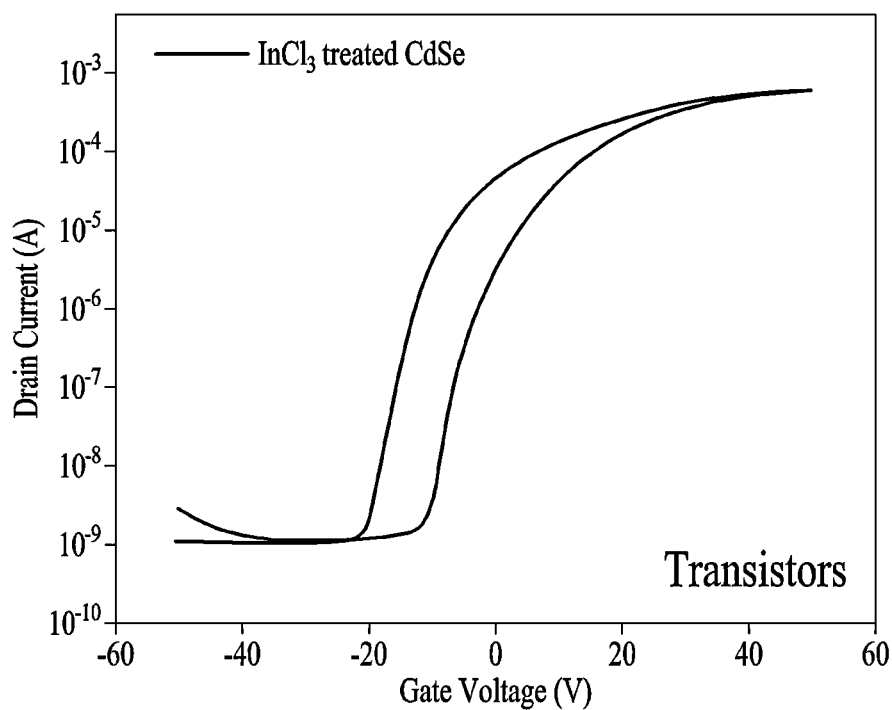
Figure 6D:
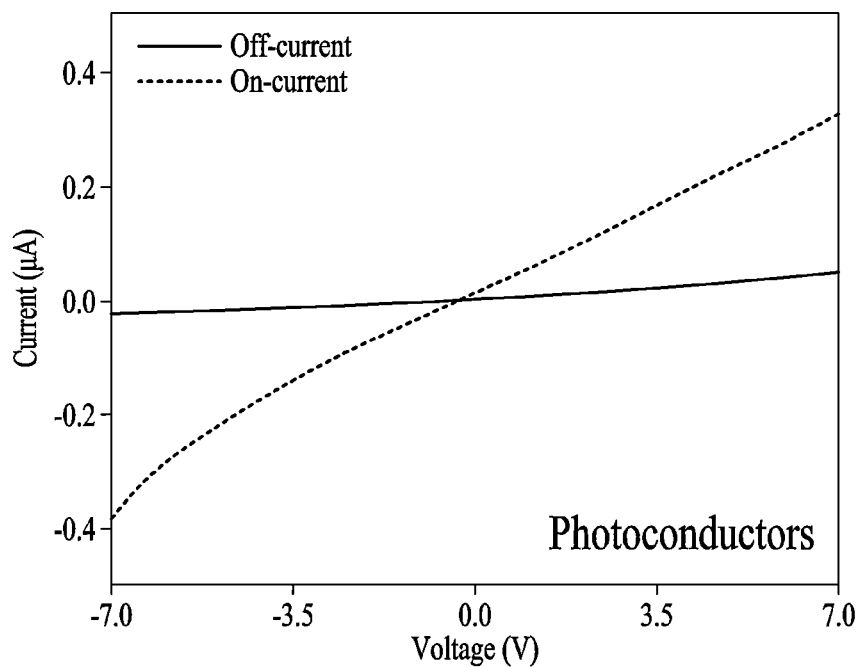
Figure 8:
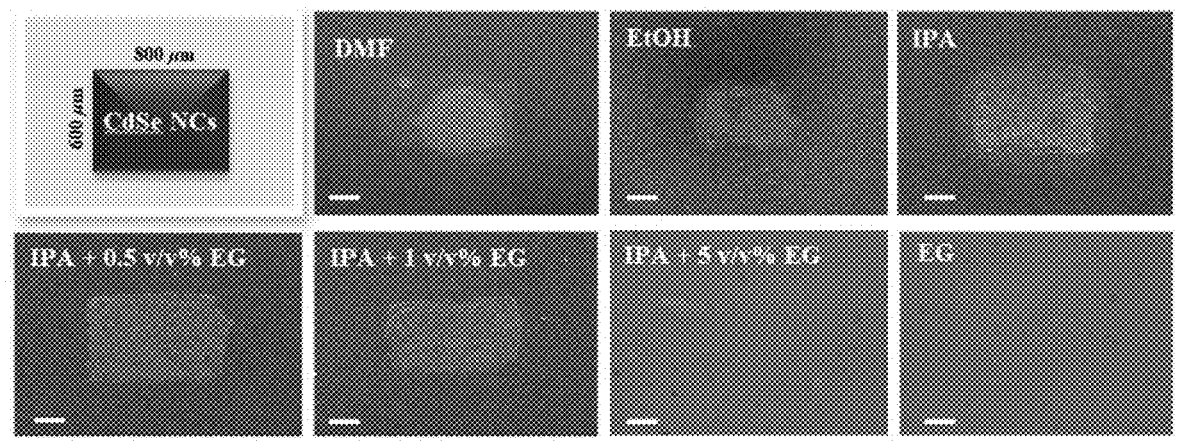
FIG. 8 illustrates property evaluation results of substrates patterned by ink lithography according to Examples 15 to 20 of the present disclosure.
Figure 9:
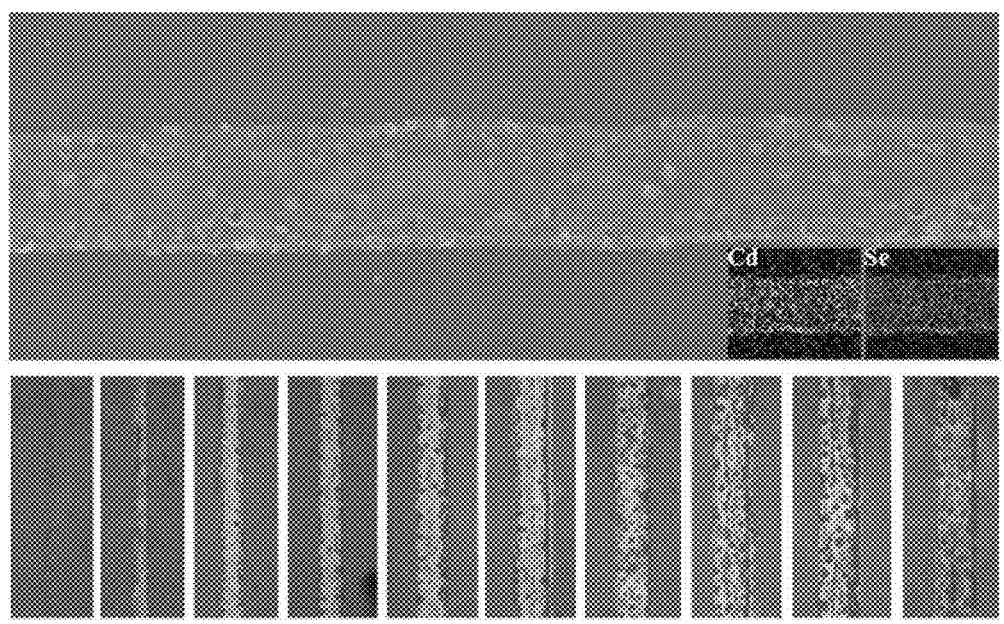
FIG. 9 illustrates property evaluation results of a substrate patterned by ink lithography according to Example 18 of the present disclosure.

| Classification | Thin nanoparticle film | Drawing | Property evaluation |
|---|---|---|---|
| Example 2 | Example 1-1 | FIG. 4a | Property Evaluation 1 |
| Example 3 | (Ag nanoparticle | FIG. 4b | |
| Example 4 | thin film) | FIG. 4c | |
| Example 5 | Example 1-2 | FIG. 5 | Property Evaluation 2 |
| Example 6 | ($CsPbBr_3$, | | |
| Example 7 | nanoparticle | | |
| Example 8 | thin film) | | |
| Comparative Example 1 | | | |
| Example 9 | Example 1-3 | FIG. 6a | Property Evaluation 3 |
| Example 10 | (CdSe, | | |
| Example 11 | nanoparticle | | |
| Comparative Example 2 | thin film) | | |
| Example 12 | Example 1-4 | FIG. 6b | |
| Example 13 | (PbSe nanoparticle thin film) | | |
| Example 14 | Example 1-3 (CdSe nanoparticle thin film) | FIGS. 6c and 6d | |
| Example 15 | Example 1-3 | FIG. 8 | Property Evaluation 5 |
| Example 16 | (CdSe | | |
| Example 17 | nanoparticle | | |
| Example 18 | thin film) | | |
| Example 19 | | | |
| Example 20 | | | |
| Example 18 | | FIG. 9 | |

Property Evaluation 1.

Experiments were carried out using the PET substrates patterned according to Examples 2 to 4. Results are illustrated in FIGS. 4a to 4c.

Referring to FIGS. 4a to 4c, it can be confirmed that various physical properties may be imparted to the metal nanoparticles according to a distance between the metal nanoparticles.

FIG. 4a illustrates a results of an experiment conducted using Example 2. It can be confirmed that the nanoparticle thin film may be used as an electrode because the electron movement mechanism has metallic when the distance between the particles is close.

FIG. 4b illustrates a results of an experiment conducted using Example 3. It can be confirmed that the nanoparticle thin film may be used as a temperature sensor because phonon scattering occurs and electrothermal physical properties are induced when the distance between the particles is moderately reduced. In Example 3, $NH_4Br$ may be used instead of TBAB.

FIG. 4c illustrates a results of an experiment conducted using Example 4. It can be confirmed that the distance between the particles is greatly increased due to mechanical deformation when the distance between the particles further increases, so that resistance greatly increases. Accordingly, the nanoparticle thin film may be used as a strain detection sensor. To control the electron movement mechanism by tunneling and hopping transport, I ions, which are a relatively long inorganic halide ligand, were used. In particular, electrical physical properties are exhibited because I ions are very small compared to the size of initial organic ligand and, at the same time, electro-mechanical physical properties are also exhibited because I ions are large compared to Cl and Br. $NH_4I$ may be used instead TBAI of Example 4.

Each numeral value of FIGS. 4a to 4c are as follows. The electrode following metallic transport exhibited a specific resistance of about $3.2 \times 10^{-5}$ Ωcm, the temperature sensor in which phonon scattering occurs exhibited a temperature coefficient of resistance (TCR) of $1.4 \times 10^{-3}$/K, and the strain sensor wherein a distance between particles was long exhibited a gauge factor of about 87.4.

Property Evaluation 2.

An experiment was carried out using the PET substrate patterned according to each of Examples 5 to 8 and Comparative Example 1. Results are illustrated in FIG. 5. Comparative Example 1 was denoted as "As-synthesized" in FIG. 5.

In the case of the inorganic halide perovskite ($CsPbX_3$), it is characterized in that a band gap is easily changed according to the halide ion and composition. Since the bandgap is an energy level that emits and absorbs light in the visible light region, it may be used in displays, color-filters, and the like. In addition, a composition (I-dominant $CsPbX_3$) that can easily generate phase transition may be induced by controlling the composition as described above, which can be applied to photovoltaics such as solar cells, memory devices, etc.

Referring to FIG. 5, it can be confirmed that the band gap of perovskite nanoparticles which is a light emitting material is adjusted according to a ligand type and a composition. The photoluminescence (PL) wavelength center peak, which is changed according to a band gap, of the chlorine ions ($Cl^-$)-treated $CsPbBr_3$ perovskite nanoparticles was changed from 520 nm (green) to 452 nm (blue), and the band gap energy of the iodine ion ($I^-$)-treated $CsPbBr_3$ perovskite nanoparticles was converted to emit light at 680 nm (red).

Since perovskite has very low oxidative stability, a structure may collapse when a hydrophilic ligand, such as MPA, EDT, or $Na_2S$, for patterning is treated. Accordingly, to implement a green pattern, NaBr was used such that an initial hydrophobic organic ligand can be changed into a hydrophilic inorganic ligand without the occurrence of anion exchange.

Trioctylamine (TOA) has a basic amine group, and thus, can easily access to an electron-deficient material. In addition, since TOA has very high reactivity, it can cause phase transition or surface defects through binding and interaction with a perovskite material having very high reactivity by promoting bonding and ionization with a material, thereby inhibiting photoluminescence emission. Accordingly, in the experiment, TOA was used as a quenching material for reducing the optical properties of perovskite material.

Property Evaluation 3.

Experiments were carried out using the PET substrates patterned according to Examples 9 to 11 and Comparative Example 2. Results are illustrated in FIG. 6a. In FIG. 6a, Comparative Example 2 is denoted as "As-synthesized."

Experiments were carried out using the PET substrates patterned according to Examples 12 and 13. Results are illustrated in FIG. 6b.

Experiments were carried out using the PET substrate patterned according to Example 14. Results are illustrated in FIGS. 6c and 6d.

Referring to FIG. 6a, it can be confirmed that the emission efficiency of photoluminescence (PL) of the CdSe nanoparticles which are a light emitting material varies depending upon the passivation degree of the ligand. It can be confirmed that the luminescence intensity of the MPA-substituted CdSe nanoparticle thin film is almost maintained. In addition, it can be confirmed that in the case of CdSe substituted with halogen ions, surface trapping may occur, or exciton transition occurs due to defects in a level (in-gap state) that may induce non-radiative recombination so that PL is quenched. Conversely, it can be confirmed that the $PbAc_2$-treated CdSe nanoparticles have greatly improved optical physical properties, which indicates that $Pb^{2+}$ increases the light absorption rate of CdSe nanoparticles and, at the same time, acetate improves surface passivation and thus photoluminescence (PL) emission increases.

Referring to FIG. 6b, it can be confirmed that the chalcogenide (PbSe) nanoparticles may implement doping effect using a surface ligand. It can be confirmed that, by remote doping, carrier scattering does not excessively occur and, at the same time, electromagnetic properties may be changed.

Specifically, the thin-film transistor (TFT) is fabricated by printing the TBAI or TMAOH ligand ink on the PbSe nanoparticle thin film. Each of the ligands is well known to dope an n-type or p-type nanoparticle film. The PbSe nanoparticle thin film TFT treated with TBAI exhibits an electron mobility of $(1.0 \pm 0.3) \times 10^{-1}$ $cm^2$ $V^{-1}$ $s_{-1}$ as a transfer characteristic. The TMAOH-treated PbSe nanoparticle thin film TFT exhibits a saturated hole mobility of $(0.7 \pm 0.2) \times 10^{-1}$ $cm^2$ $V^{-1}$ $s^{-1}$.

FIG. 6c illustrates data of the high-mobility CdSe nanoparticles TFT doped and patterned using the $InCl_3$ ligand ink. Indium is a well-known n-type dopant only for the CdSe nanoparticles, and the surface state of $Cl^-$ ions may be better protected compared to other halide ligands. Both $In^{3+}$ and $Cl^-$ serve to change the chemical properties of a film from a hydrophobic state to a hydrophilic state, thereby allowing patterning. The $InCl_3$-treated CdSe nanoparticles TFT exhibits a high electron mobility of $1.5 \pm 0.5$ $cm^2$ $V^{-1}$ $s^{-1}$, as a transfer characteristic, and n-type polarity.

FIG. 6d illustrates visible light detection performance data verified using the $InCl_3$-treated CdSe nanoparticle thin film. The reactivity of the CdSe nanoparticle thin film photoconductor to Vis (532 nm) light is 4.0 mA/W.

Property Evaluation 4.

Figure 7:
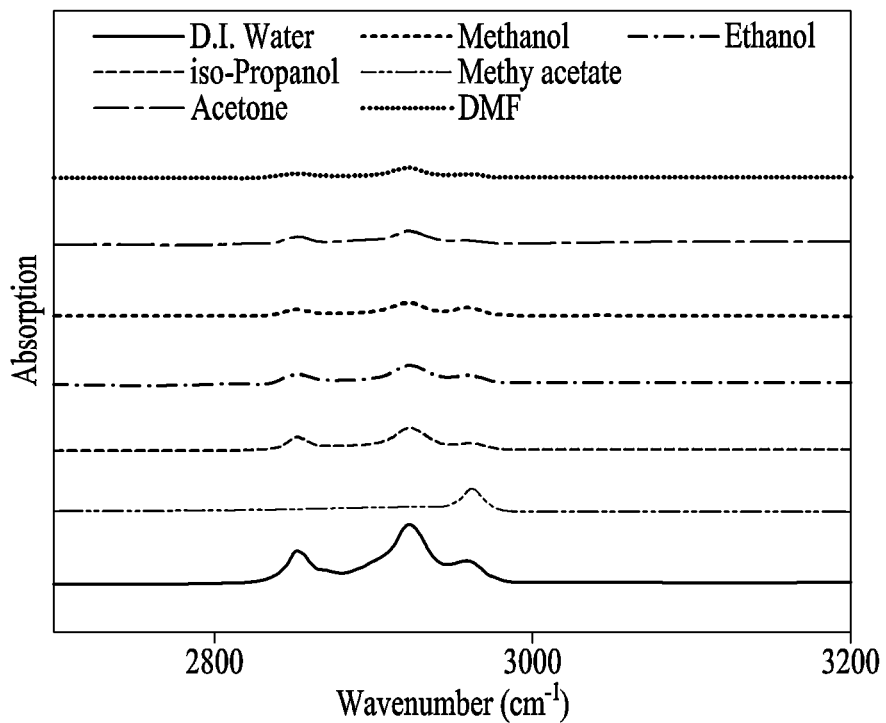
FIG. 7 illustrates property evaluation results of a ligand-substituting ink of the present disclosure.

Referring to FIG. 7, it can be confirmed that the solvent used in the ink lithography technique is not only used for dissolving/dispersing a ligand solute, but also for dropping the organic ligand (oleylamine or oleic acid) immediately after synthesis to perform ligand exchange to help to facilitate ligand exchange.

For this, the density, viscosity, and surface energy of the solvent to be used in the ligand-substituting ink were measured and summarized in Table 3 below.

Referring to an upper part of Table 3, water, methanol (MeOH), ethanol (EtOH), isopropanol (IPA), acetone, dimethylformamide (DMF), methyl acetate (M.A.), and ethylene glycol (E.G.) were used as the solvents. Referring to a lower part of Table 3, mixed solvents prepared by mixing isopropanol (IPA) with ethylene glycol (E.G.) in a volume of 0.1 v/v %, 0.5 v/v %, 1 v/v %, and 5 v/v % were used as the solvents.

The ligand detachability of the solvents used for the ligand-substituting ink was analyzed by FTIR, and data thereof is illustrated in FIG. 7.

As the solvent, D.I. water, methanol, ethanol, isopropanol, methyl acetate, acetone, and dimethylformamide (DMF) were used.

In FIG. 7, a peak between 2800 and 3200 $cm^{-1}$ means C—H stretching. Since an organic ligand contains a lot of C—H bonding, the presence or absence of oleic acid and oleylamine may be known by the peak.

It can be confirmed that other solvents, except for water ($H_2O$), serve to detach most of organic ligands.

That is, ligand exchange may be performed without harsh conditions (annealing, laser exposure, removal/etching) unlike existing cases.

substitution is made from the time when the width becomes at least 35 μm. Referring to a photograph at a lower part of FIG. 9, a line width of about 30 μm or less appears in the first and second photographs. In these photographs, ligand substitution does not occur sufficiently, and thus, the substituted portion (bright region) is very small.

The line width gets thicker as it goes to the right photograph, but when it becomes thicker than 80 μm, the surface becomes non-uniform due to aggregation of the ligand solution. Accordingly, when inkjet printing is used, the width of the line pattern is preferably 35 μm to 80 μm. As shown in the photographs in the middle part, the most optimized width of a line pattern is about 77 μm.

Referring to Property Evaluation 4 and FIG. 7, the ink lithography technique of the present disclosure uses ligand substitution, so that patterning may be carried out at room temperature and under atmospheric pressure without being in contact with nanoparticles. Accordingly, it is important

TABLE 3

|  | Density [kg/m^3] | Viscosity [mPa·s] | Surface tension [mN/m] | $N_{Re}$ | $N_{We}$ | $N_{Oh}$ | Z |
|---|---|---|---|---|---|---|---|
| Water | 1000 | 0.89 | 72.7 | 70.8 | 2.6 | 0.02 | 43.9 |
| MeOH | 787 | 0.54 | 22.1 | 93.8 | 6.7 | 0.03 | 35.4 |
| EtOH | 787 | 1.07 | 23 | 46.3 | 6.8 | 0.06 | 17.8 |
| IPA | 783 | 2.05 | 23.3 | 24.1 | 6.35 | 0.10 | 9.54 |
| Acetone | 784 | 0.31 | 23 | 159.3 | 6.4 | 0.02 | 62.8 |
| DMF | 945 | 0.79 | 34.4 | 73.4 | 5.2 | 0.03 | 33.1 |
| M.A. | 927 | 0.36 | 24.5 | 162.2 | 7.2 | 0.02 | 60.7 |
| E.G. | 1105 | 15.80 | 45.5 | 4.4 | 4.6 | 0.49 | 2.05 |

| Mixture | density [kg/m^3] | viscosity [mPa·s] | surface tension [mN/m] | Reynolds # | Weber # | Ohnesorge # | Z; 1/Ohnesorge # |
|---|---|---|---|---|---|---|---|
| 0.1% EG | 783.3 | 2.05 | 23.3 | 24.02 | 6.35 | 0.10 | 9.53 |
| 0.5% EG | 784.6 | 2.07 | 23.5 | 23.88 | 6.31 | 0.11 | 9.51 |
| 1% EG | 786.3 | 2.09 | 23.6 | 23.70 | 6.30 | 0.11 | 9.45 |
| 5% EG | 799.4 | 2.27 | 24.8 | 22.19 | 6.09 | 0.11 | 8.99 |

Property Evaluation 5.

Experiments were carried out using the PET substrates patterned according to Examples 15 to 20. Results are illustrated in FIG. 8.

Referring to FIG. 8, it can be confirmed that resolution is different depending upon a solvent, and the printed product including 0.5 v/v % of ethylene glycol shows the best resolution. That is, it can be seen that a solvent plays an important role in the printing performance. This means that the ligand exchange and spraying ability should be considered together. In addition, when 0.5 v/v % of ethylene glycol is included, surface energy (surface tension) and viscosity are improved to appropriate values, which may indicate that a solvent suitable for inkjet printing is prepared.

Appropriate surface energy and viscosity are very important factors in the fluid dynamics and may be used as a measure of how well a pattern can be formed as ink droplets are cracked or scattered as they fall.

In general, when the viscosity is high, an inkjet printer does not have enough energy to generate ink droplets so that a solution cannot be dropped from the cartridge. On the other hand, when the viscosity is low, ink droplets are scattered while falling, which may deteriorate pattern resolution.

An experiment was carried out using the PET substrate patterned according to Example 18. Results are illustrated in FIG. 9.

Referring to FIG. 9, it can be confirmed that a line-shaped pattern may be drawn such that sufficient surface ligand that ligand substitution occurs easily. Referring to Property Evaluation 4 and FIG. 7, when a solvent used for substitution are polar solvents except for water, an organic ligand is well detached, thereby helping ligand substitution.

Existing inkjet printing technologies have a problem of low resolution. To improve the resolution, a polar solvent having high surface energy and viscosity should be added. Accordingly, the present disclosure uses a mixture including ethylene glycol that is a solvent having a viscosity suitable for inkjet printing. Referring to Property Evaluation 5 and FIG. 8, it can be confirmed that the highest resolution is exhibited when ethylene glycol is added in a volume of 0.5 v/v % to IPA.

In accordance with an embodiment of the present disclosure, functionality can be imparted to a material in existing material and device manufacturing processes, and respective processes of fabricating the material in a pattern shape can be combined in a single process.

In addition, in accordance with an embodiment of the present disclosure, existing device fabrication processes including respective independent process steps may cause the damage or contamination of material and pattern. However, when the respective independent process steps are combined into a single process as in the present disclosure, damage of a material and pattern can be prevented, and devices having various functions can be fabricated on one substrate.

In addition, in accordance with an embodiment of the present disclosure, since the present disclosure uses a surface ligand substitution method of performing patterning at room temperature under atmospheric pressure, the present disclosure can be applied even to a polymer-based substrate that is weak to heat or pressure, and thus, can be easily applied even to flexible or stretchable devices.

Further, in accordance with an embodiment of the present disclosure, various devices can be fabricated to have multi-functionality at a low cost using nanoparticles-based thin film, so that a method of fabricating a device very suitable for commercialization can be provided.

Although the present disclosure has been described through limited examples and figures, the present disclosure is not intended to be limited to the examples. Those skilled in the art will appreciate that various modifications, additions and substitutions are possible, without departing from the scope and spirit of the disclosure. Therefore, it should be understood that there is no intent to limit the disclosure to the embodiments disclosed, rather, the disclosure is to cover all modifications, equivalents, and alternatives falling within the spirit and scope of the disclosure as defined by the claims.

What is claimed is:

1. A patterning method by ink lithography, the patterning method comprising:
   coating nanoparticles surrounded by a first ligand on a substrate to form a nanoparticle thin film;
   spraying a ligand-substituting ink to a partial region of the nanoparticle thin film formed on the substrate to form a first region, in which the first ligand is substituted with a second ligand, and a second region in which the first ligand is not substituted with the second ligand; and
   washing the substrate comprising the first region and the second region with a washing solvent,
   wherein, by the washing, the second region is selectively removed so that the first region is patterned.

2. The patterning method according to claim 1, wherein the ligand-substituting ink further comprises ethylene glycol, and in spraying of the ligand-substituting ink, resolution is further improved.

3. The patterning method according to claim 1, wherein the first ligand is an organic ligand.

4. The patterning method according to claim 3, wherein the organic ligand has hydrophobic chemical properties.

5. The patterning method according to claim 1, wherein the second ligand is an inorganic ligand or an organic/inorganic complex ligand.

6. The patterning method according to claim 5, wherein the inorganic ligand or the organic/inorganic complex ligand has hydrophilic chemical properties.

7. The patterning method according to claim 1, wherein the spraying of the ligand-substituting ink is any one selected from the group consisting of inkjet printing, spray coating, calligraphy and dropping.

8. The patterning method according to claim 1, wherein the washing solvent is a non-polar solvent.

9. The patterning method according to claim 8, wherein the non-polar solvent disperses nanoparticles having hydrophobic chemical properties.

10. The patterning method according to claim 8, wherein the non-polar solvent is at least one selected from among octane, hexane, toluene, cyclohexane, chlorobenzene, benzene, chloroform and diethyl ether.

* * * * *